(12) United States Patent
Lee

(10) Patent No.: US 9,508,418 B1
(45) Date of Patent: Nov. 29, 2016

(54) SEMICONDUCTOR DEVICE

(71) Applicant: SK hynix Inc., Icheon-si Gyeonggi-do (KR)

(72) Inventor: Kyong Ha Lee, Yongin-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/870,973

(22) Filed: Sep. 30, 2015

(30) Foreign Application Priority Data

Jun. 24, 2015 (KR) ......................... 10-2015-0089934

(51) Int. Cl.
*G11C 7/00* (2006.01)
*G11C 11/409* (2006.01)
*G11C 11/408* (2006.01)

(52) U.S. Cl.
CPC .......... *G11C 11/409* (2013.01); *G11C 11/4085* (2013.01); *G11C 11/4087* (2013.01); *G11C 7/00* (2013.01)

(58) Field of Classification Search
CPC ... G11C 16/26; G11C 16/10; G11C 11/5642; G11C 11/5628; G11C 13/0069; G11C 13/004; G11C 11/1675; G11C 11/1673; G11C 16/30; G11C 11/419; G11C 13/003; G11C 11/1659; G11C 11/1697; G11C 13/0028

See application file for complete search history.

(56) References Cited

U.S. PATENT DOCUMENTS

| 2005/0057987 | A1* | 3/2005 | Fujimoto | G11C 7/12 365/205 |
| 2010/0042880 | A1* | 2/2010 | Sakai | G11C 29/56 714/719 |
| 2011/0205812 | A1* | 8/2011 | Kajigaya | G11C 11/4091 365/189.05 |
| 2012/0327734 | A1* | 12/2012 | Sato | G11C 5/14 365/226 |
| 2014/0089574 | A1 | 3/2014 | Sohn et al. | |
| 2015/0098287 | A1 | 4/2015 | Lee | |
| 2015/0243347 | A1* | 8/2015 | Hayashi | G11C 11/408 365/230.03 |

* cited by examiner

*Primary Examiner* — Son Dinh
*Assistant Examiner* — Uyen B Tran
(74) *Attorney, Agent, or Firm* — William Park & Associates Ltd.

(57) ABSTRACT

A semiconductor device may include: a command decoder configured to decode a clock signal, a chip selection signal, and a command address, and output an active write signal, an active read signal, and a precharge signal indicating a write operation or a read operation after completion of an active operation; a row controller configured to output a bank active signal for controlling an active operation of a bank in response to the active write signal, the active read signal, and the precharge signal, and output an active write flag signal or an active read flag signal for performing the write operation or the read operation; and a column controller configured to output a control signal for controlling a column active operation to the bank in response to the active write flag signal, the active read flag signal, a write command signal, a read command signal, and the precharge signal.

31 Claims, 6 Drawing Sheets

SEMICONDUCTOR DEVICE

CROSS-REFERENCE TO RELATED APPLICATION

This application claims priority based upon Korean patent application No. 10-2015-0089934, filed on Jun. 24, 2015, the disclosure of which is hereby incorporated in its entirety by reference herein.

BACKGROUND

1. Technical Field

Embodiments of the present disclosure generally relate to a semiconductor device, and more particularly to a technology for controlling the semiconductor memory by discriminating an active command.

2. Related Art

Generally, a semiconductor memory device selects a memory cell array, selects a cell from the memory cell array, and writes or reads necessary information to or from the selected cell.

In more detail, the semiconductor memory device enables a word line upon receiving an active signal during the write operation. Data loaded on a local data line is transmitted to a bit line sense amplifier selected by a column selection signal through a write driver. Thereafter, data is stored in the corresponding cell such that the write operation is performed.

The semiconductor memory device enables the word line upon receiving the active signal during the read operation. Data stored in the cell is then amplified by the bit line sense amplifier through a bit line.

The amplified data is applied to a local data line by a column selection signal. Thereafter, data is amplified by a local input/output (I/O) sense amplifier, and is then applied to a global data line, such that the read operation can be performed.

During the operation of the semiconductor device, the semiconductor device may perform the write operation or the read operation after receiving the active command. However, irrespective of whether the write operation or the read operation is performed after activation of the active command, the same active command is used in the semiconductor device.

Therefore, the semiconductor memory device is always ready to perform the write operation or the read operation even when it does not recognize which command signal will be received after reception of the active command, resulting in consumption of unnecessary operation current.

SUMMARY

According to an embodiment, there may be provided a semiconductor device. The semiconductor device may include a command decoder configured to decode a clock signal, a chip selection signal, and a command address, and output an active write signal, an active read signal, and a precharge signal indicating a write operation or a read operation after completion of an active operation. The semiconductor device may include a row controller configured to output a bank active signal for controlling an active operation of a bank in response to the active write signal, the active read signal, and the precharge signal, and output an active write flag signal or an active read flag signal for performing the write operation or the read operation. The semiconductor device may include a column controller configured to output a control signal for controlling a column active operation to the bank in response to the active write flag signal, the active read flag signal, a write command signal, a read command signal, and the precharge signal.

According to an embodiment, there may be provided a semiconductor device. The semiconductor device may include a bank configured to have an activation state of the bank controlled by a bank active signal, and to have a column active operation of the bank controlled by a control signal. The semiconductor device may include a column controller including a write operation circuit unit and a read operation circuit unit, and may be configured to output a control signal for controlling a column active operation of the bank for a write operation or read operation of the bank. The column controller may be configured to use different power-supply voltages for the write and read operation circuit units for the write operation and the read operation.

According to an embodiment, there may be provided a semiconductor device. The semiconductor device may include a column controller including a write operation circuit unit and a read operation circuit unit, and may be configured to output a control signal for controlling a column active operation of a bank for a write operation or read operation of the bank. The column controller may be configured to use different power-supply voltages for the write and read operation circuit units for the write operation and the read operation.

If the precharge signal is activated, the row controller activates the active write flag signal and the active read flag signal.

If the precharge signal is activated, the column controller controls the control signal in response to the precharge signal, without receiving the write command signal and the read command signal.

During the read operation, the write operation circuit unit is turned off and the read operation circuit unit operates to perform the read operation.

During the write operation, the read operation circuit unit is turned off and the write operation circuit unit operates to perform the write operation.

The column controller further includes: a power-supply controller configured to supply the write operation circuit unit with a write operation power-supply voltage during a write operation, and supply the read operation circuit unit with a read operation power-supply voltage during the read operation.

The semiconductor device further comprising: a row controller configured to output the bank active signal for controlling an active operation of the bank in response to an active write signal, an active read signal, and a precharge signal, and output an active write flag signal or an active read flag signal for performing the write operation or the read operation, wherein the column controller is configured to use the different power-supply voltages for the write and read operation circuit units for the write operation and the read operation in response to the active write flag signal or the active read flag signal.

The semiconductor device further comprising: a command decoder configured to decode a clock signal, a chip selection signal, and a command address, and output the active write signal, the active read signal, and the precharge signal indicating the write operation or the read operation after completion of the active operation.

The bank includes a plurality of banks, each of the banks includes a plurality of memory arrays, each memory array configured for selection of a word line with a row address and for selection of a bit line with a column address, the column address controlled by the control signal.

The column controller further includes: a power-supply controller configured to supply the write operation circuit unit with a write operation power-supply voltage during a write operation, and supply the read operation circuit unit with a read operation power-supply voltage during the read operation.

During the read operation, the write operation circuit unit does not receive a power-supply voltage and the read operation circuit unit operates to perform the read operation with the power-supply voltage.

During the write operation, the read operation circuit unit does not receive a power-supply voltage and the write operation circuit unit operates to perform the write operation with the power-supply voltage.

DETAILED DESCRIPTION

Reference will now be made in detail to embodiments of the present disclosure, examples of which are illustrated in the accompanying drawings. Wherever possible, the same reference numbers are used throughout the drawings to refer to the same or like portions. In the following description of the present disclosure, a detailed description of related known configurations or functions incorporated herein may be omitted for clarity of the subject matter of the present disclosure.

Various embodiments of the present disclosure may be directed to providing a semiconductor device that substantially obviates one or more problems due to limitations and disadvantages of the related art.

The embodiments of the present disclosure may relate to a technology for allowing information regarding an operation command to be performed after reception of an active command to be included in the active command, resulting in increased operation efficiency.

Figure 1:
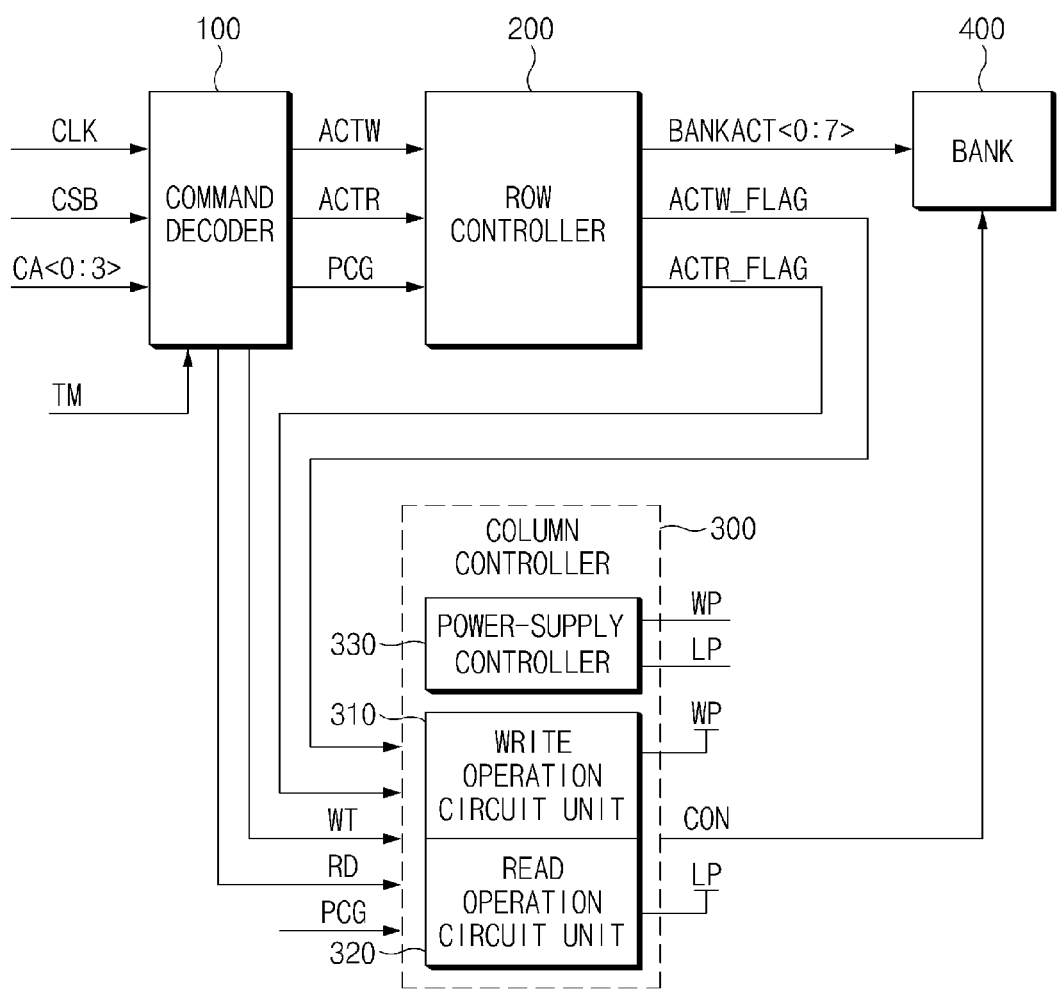
FIG. 1 is a block diagram illustrating a representation of an example of a semiconductor device according to an embodiment of the present disclosure.

FIG. 1 is a block diagram illustrating a representation of an example of a semiconductor device according to an embodiment of the present disclosure.

Referring to FIG. 1, the semiconductor device may include a command decoder 100, a row controller 200, a column controller 300, and a bank 400.

The command decoder 100 may decode a clock signal CLK, a chip selection signal CSB, a command address CA<0:3>, and a test signal TM, such that the command decoder 100 may output internal command signals, i.e., a write command signal WT, a read command signal RD, an active write signal ACTW, an active read signal ACTR, and a precharge signal PCG.

During the activation of the test signal TM, the command decoder 100 may activate the write command signal WT and the read command signal RD, irrespective of the command address CA<0:3>.

In an embodiment, for example, four command addresses CA<0:3> are input to the semiconductor device for convenience of description and better understanding of the present disclosure. However, the scope or spirit of the embodiments of the present disclosure are not limited thereto, and the number of command addresses may be changed to less or more.

The active write signal ACTW may be a command signal indicating specific information to which the write operation command is applied upon completion of the active operation. That is, the active write signal ACTW may include write access timing information upon completion of the active operation. In addition, the active read signal ACTR may be a command signal indicating specific information to which the read operation command is applied upon completion of the active operation. That is, the active read signal ACTR may include read access timing information after completion of the active operation.

In an embodiment, for example, the active write signal ACTW and the active read signal ACTR are controlled in response to the test signal TM. However, the scope or spirit of the embodiments of the present disclosure are not limited thereto, and it should be noted that the test signal TM may also be controlled by a setting record command signal (MRW). The setting record command signal MRW (not illustrated) may be used to record a setting value in the command decoder 100.

The row controller 200 may control the row active operation according to the active write signal ACTW, the active read signal ACTR, and the precharge signal PCG.

The row controller 200 may output a bank active signal BANKACT<0:7> for controlling whether to perform an active operation of the bank 400. The row controller 200 may output an active write flag signal (ACTW_FLAG) and an active read flag signal (ACTR_FLAG) to the column controller 300.

The active write flag signal (ACTW_FLAG) may be a flag signal indicating that the write operation is performed upon completion of the active operation. The active read flag signal (ACTR_FLAG) may be a flag signal indicating that the read operation is performed upon completion of the active operation.

In an embodiment, for example, 8 bank active signals BANKACT<0:7> are used. However, the scope or spirit of the embodiments of the present disclosure are not limited thereto, and the number of bank active signals may be changed as necessary.

The column controller 300 may receive the active write flag signal (ACTW_FLAG), the active read flag signal (ACTR_FLAG), the write command signal WT, the read command signal RD, and the precharge signal PCG. The column controller 300 may output a control signal (CON) for controlling the column active operation to the bank 400.

In this example, the column controller 300 may include a write operation circuit unit 310, a read operation circuit unit 320, and a power-supply controller 330.

If the active write flag signal (ACTW_FLAG) is activated, only the write operation circuit unit 310 of the column controller 300 may operate to perform the write operation in response to the write command signal WT.

If the active read flag signal (ACTR_FLAG) is activated, only the read operation circuit unit 320 of the column controller 300 may operate to perform the read operation in response to the read command signal RD.

The column controller 300 may be categorized into the write operation circuit unit 310 synchronized with the write clock during the write operation and the read operation circuit unit 320 synchronized with the read clock during the read operation.

The column controller 300 may use different power-supply voltages for each circuit scheduled to operate during the write operation and each circuit scheduled to operate during the read operation.

For this purpose, the column controller 300 may include a power-supply controller 330 for controlling not only a power-supply voltage supplied to the write operation circuit unit 310, but also a power-supply voltage supplied to the read operation circuit unit 320 in different ways.

The power-supply controller 330 may receive the active write flag signal (ACTW_FLAG) and the active read flag signal (ACTR_FLAG), and may control the write operation power-supply voltage (WP) and the read operation power-supply voltage (LP) independently from each other.

The power-supply controller 330 may activate the write operation power-supply voltage (WP) during activation of the active write flag signal (ACTW_FLAG). Therefore, the write operation circuit unit 310 may be controlled by the write operation power-supply voltage (WP) during the write operation.

If the active write flag signal (ACTW_FLAG) is activated, the active read flag signal (ACTR_FLAG) is deactivated, such that the read operation power-supply voltage (LP) is not supplied to the read operation circuit unit 320. Therefore, the read operation circuit unit 320 is turned off during the write operation mode, such that the operation current can be reduced.

The power-supply controller 330 may activate the read operation power-supply voltage (LP) of the active read flag signal (ACTR_FLAG). Therefore, the read operation circuit unit 320 may be controlled by the read operation power-supply voltage (LP) during the read operation.

If the active read flag signal (ACTR_FLAG) is activated, the active write flag signal (ACTW_FLAG) is deactivated, such that the write operation power-supply voltage (WP) is not supplied to the write operation circuit unit 310. Therefore, the write operation circuit unit 310 is turned off during the read operation mode, such that the operation current can be reduced.

The address path may include a row address path, a column address path, and a data path. The row address path may amplify data stored in a memory cell using a sense amplifier, after the word line has been selected by a row address. The column address path may be used to select one of a plurality of output enable signals using a column address. The data path may be used to transmit data to an external part through an input/output (I/O) sense amplifier and a data output buffer.

The column address path selection operation from among the above-mentioned path operations may be controlled by the column controller 300 comprised of a column decoder. The column controller 300 may decode the column address such that it can selectively enable one of a plurality of output enable signals. The column controller 300 may transmit data loaded on the bit line selected by the enabled output enable signal to the input/output (I/O) lines.

A semiconductor memory device such as DRAM may include a plurality of banks 400 comprised of a plurality of memory cells having the same address. The semiconductor memory device may simultaneously output data of memory cells having the same address contained in each bank 400. For this purpose, the column controller 300 may selectively enable one of the plurality of output enable signals by decoding a column address, and may perform a column operation in which data loaded on the bit line selected by each bank 400 is simultaneously transmitted to the I/O line.

The bank 400 may be activated by the bank active signal (BANKACT<0:7>), and the column line may be activated by the control signal (CON), such that the read, write, or precharge operation of data can be controlled.

The bank 400 may include a plurality of memory arrays, such that the bank 400 may perform the read, write, or precharge operation of data using the control signal (CON). During the write operation, data received from an external part of the bank 400 may be stored in the memory arrays. During the read operation, data stored in the memory arrays may be output to the external part of the bank 400 through the data output unit.

An activation state of the bank 400 may be controlled by the bank active signal (BANKACT<0:7>) received from the row controller 200, such that the word line can be selected by the row address.

The bank 400 may be controlled by the control signal (CON) received from the column controller 300, and a column line (bit line) may be selected by the column address. That is, the column controller 300 may access data of the bit line selected by the column address controlled by the control signal (CON).

Cell arrays classified by a plurality of banks in a semiconductor device may be located in the bank 400. The cell arrays classified by the bank 400 may be accessed by the bank address, such that the read or write operation of data can be achieved.

As described above, the embodiments of the present disclosure can pre-recognize a command to be received after completion of the active operation, such that the operation efficiency of the semiconductor memory device (i.e., DRAM) can be increased and the operation current of the semiconductor memory device (i.e., DRAM) can be reduced.

FIGS. 2 to 5 are timing diagrams illustrating representations of examples of the operations of the semiconductor devices according to various embodiments of the present disclosure.

Figure 2:
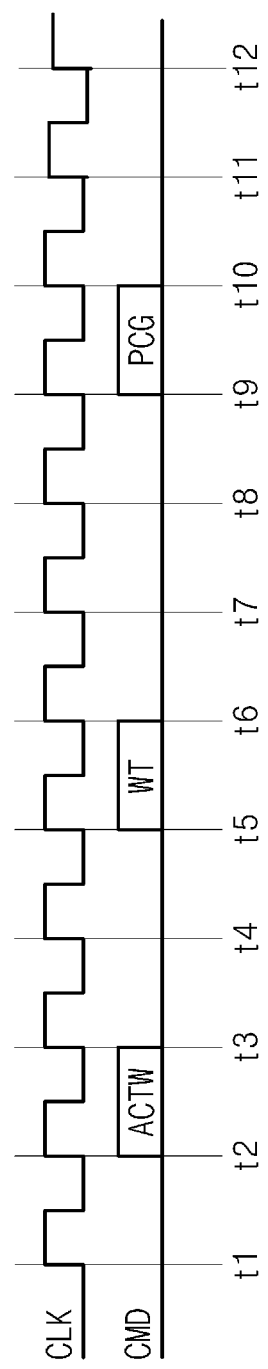
FIG. 2 is a timing diagram illustrating a representation of an example of a write operation to be performed after completion of an active operation in the semiconductor device according to an embodiment of the present disclosure.

FIG. 2 illustrates, for example, that the write operation is performed after completion of the active operation.

The command decoder 100 may generate a command signal (CMD) in response to the clock signal (CLK), the chip selection signal (CSB), and the command address (CA<0:3>). If the command decoder 100 activates the active write signal (ACTW) using the command signal CMD, the row controller 200 may activate the bank active signal (BANKACT<0:7>) and the active write flag signal (ACTW_FLAG). If the bank active signal (BANKACT<0: 7>) is activated, the corresponding bank 400 may be activated.

In this example, the active write signal (ACTW) may be activated to a high level pulse during one cycle of the clock signal (CLK).

The column controller 300 may control the column active operation in response to the write command signal (WT), and may output a control signal (CON) to the bank 400. In this example, the column controller 300 may receive the write command signal (WT) in response to the active write flag signal (ACTW_FLAG), such that it can operate only circuits associated with the write operation. Here, the write command signal (WT) may be activated to a high level pulse during one cycle of the clock signal (CLK).

As a result, the circuits needed for the read operation do not operate such that an unnecessary operation current can be prevented from being consumed.

Thereafter, the command decoder 100 may activate the precharge signal (PCG). Here, the precharge signal (PCG) may be activated to a high level pulse during one cycle of the clock signal (CLK).

As a result, the row controller 200 may deactivate the active write flag signal (ACTW_FLAG) and the active read flag signal (ACTR_FLAG). The column controller 300 may output the control signal (CON) needed to perform the precharge operation in response to the precharge signal (PCG) to the bank 400, without receiving the write command signal (WT) and the read command signal (RD).

Figure 3:
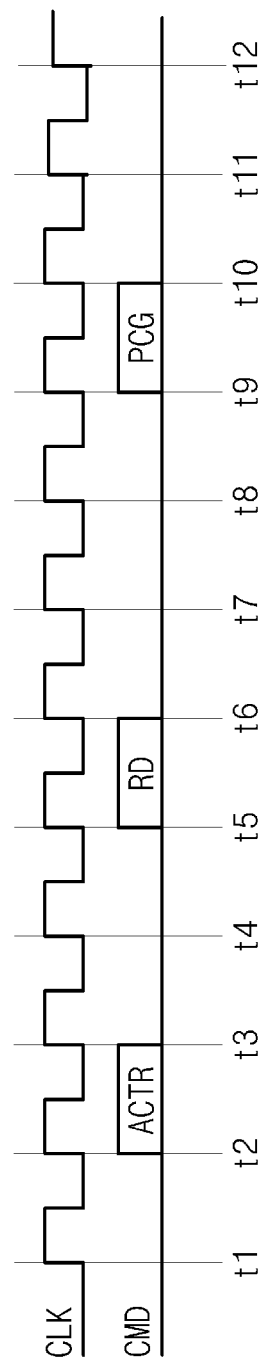
FIG. 3 is a timing diagram illustrating a representation of an example of a read operation to be performed after completion of an active operation in the semiconductor device according to an embodiment of the present disclosure.

FIG. 3 illustrates, for example, that the read operation is performed after completion of the active operation.

Referring to FIG. 3, the command decoder 100 may generate a command signal (CMD) in response to the clock signal (CLK), the chip selection signal (CSB), and the command address (CA<0:3>). If the command decoder 100 activates the active read signal (ACTR) using the command signal (CMD), the row controller 200 may activate the bank active signal (BANKACT<0:7>) and the active read flag signal (ACTR_FLAG). If the bank active signal (BANKACT<0:7>) is activated, the corresponding bank 400 may be activated.

In this example, the active read signal (ACTR) may be activated to a high level pulse during one cycle of the clock signal (CLK).

As a result, the column controller 300 may control the column active operation in response to the read command signal (RD), and may output the control signal (CON) to the bank 400. In this example, the column controller 300 may receive the read command signal (RD) in response to the active read flag signal (ACTR_FLAG), such that it can operate only circuits associated with the read operation. Here, the read command signal (RD) may be activated to a high level pulse during one cycle of the clock signal (CLK).

Therefore, the circuits needed for the write operation do not operate such that an unnecessary operation current can be prevented from being consumed.

Thereafter, the command decoder 100 may activate the precharge signal (PCG). Here, the precharge signal (PCG) may be activated to a high level pulse during one cycle of the clock signal (CLK).

As a result, the row controller 200 may deactivate the active write flag signal (ACTW_FLAG) and the active read flag signal (ACTR_FLAG). The column controller 300 may output the control signal (CON) needed to perform the precharge operation in response to the precharge signal (PCG) to the bank 400, without receiving the write command signal (WT) and the read command signal (RD).

Figure 4:
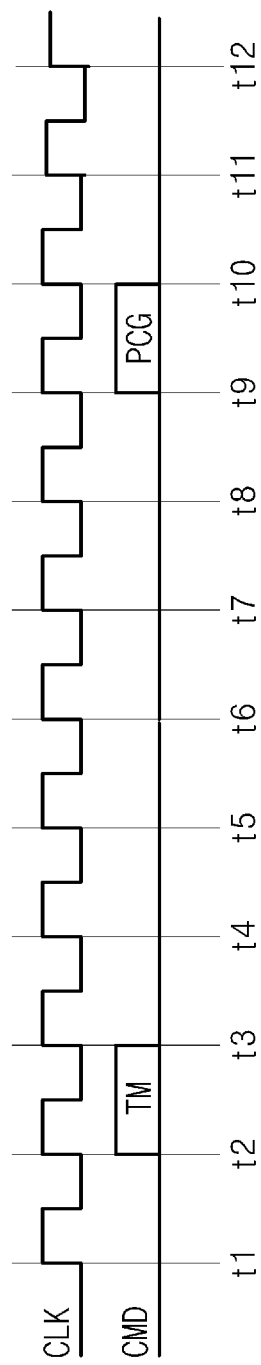
FIG. 4 is a timing diagram illustrating a representation of an example of a precharge operation to be performed after completion of an active operation in the semiconductor device according to an embodiment of the present disclosure.

FIG. 4 illustrates, for example, that the precharge operation is immediately performed without execution of the read or write operation after completion of the active operation.

The command decoder 100 may generate a command signal (CMD) in response to the clock signal (CLK), the chip selection signal (CSB), and the command address (CA<0:3>). If the test signal TM is activated, the command decoder 100 may deactivate the active write signal (ACTW) and the active read signal (ACTR).

As can be seen from the timing diagram of FIG. 4, the test signal (TM) may be used to deactivate both the active write signal (ACTW) and the active read signal (ACTR). For example, the test signal (TM) may be activated to a high level pulse during one cycle of the clock signal (CLK).

As a result, the row controller 200 may deactivate the bank active signal (BANKACT<0:7>), the active write flag signal (ACTW_FLAG), and the active read flag signal (ACTR_FLAG). If the bank active signal (BANKACT<0:7>) is deactivated, the corresponding bank 400 may be deactivated.

As a result, the column controller 300 may control the column line operation in response to the precharge signal (PCG), and may output the control signal (CON) to the bank 400. In this example, the precharge signal (PCG) may be activated to a high level pulse during one cycle of the clock signal (CLK).

In this example, since the active write flag signal (ACTW_FLAG) and the active read flag signal (ACTR_FLAG) are deactivated, the column controller 300 may operate circuits associated with the precharge signal (PCG) without receiving the write command signal (WT) and the read command signal (RD).

The column controller 300 may output the control signal (CON) needed to perform the precharge operation in response to the precharge signal (PCG) to the bank 400, without receiving the write command signal (WT) and the read command signal (RD).

Figure 5:
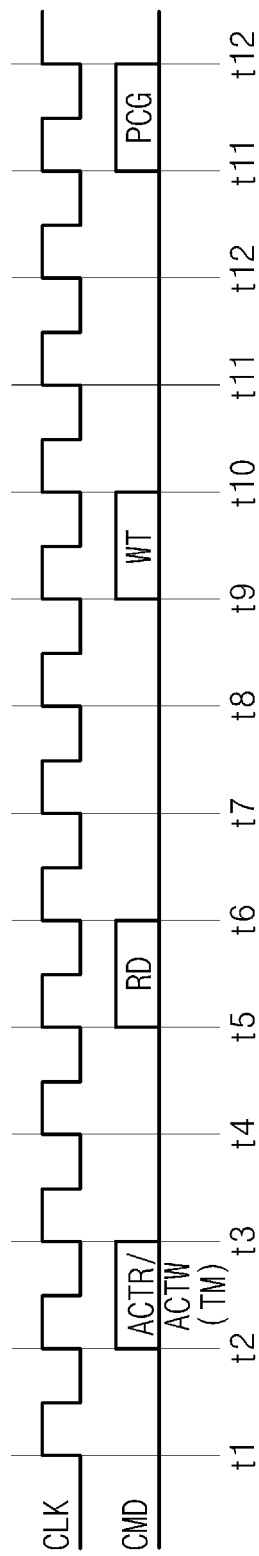
FIG. 5 is a timing diagram illustrating a representation of an example of the read and write operations to be performed after completion of an active operation in the semiconductor device according to an embodiment of the present disclosure.

FIG. 5 illustrates, for example, that the read operation and the write operation are performed after completion of the active operation.

During the test mode, an embodiment illustrated in FIG. 5 reads data stored in a cell of the bank 400, and re-writes data in the cell, such that it can recognize whether data is changed to another data.

First, the command decoder 100 may generate a command signal (CMD) in response to the clock signal (CLK), the chip selection signal (CSB), and the command address (CA<0:3>). If the test signal (TM) is activated during the test mode, the command decoder 100 may deactivate both the active write signal (ACTW) and the active read signal (ACTR). Here, the test signal (TM) may be activated to a high level pulse during one cycle of the clock signal CLK.

In an embodiment of FIG. 5, the test signal (TM) may be used to activate the active write signal (ACTW) and the active read signal (ACTR).

Therefore, if the command decoder 100 activates the active write signal ACRW and the active read signal (ACTR) using the command signal (CMD), the row controller 200 may activate the bank active signal BANKACT<0:7>, the active write flag signal ACTW_FLAG, and the active read flag signal (ACTR_FLAG). If the bank active signal (BANKACT<0:7>) is activated, the bank 400 may be activated.

In this example, the row controller 200 may first activate the active read flag signal (ACTR_FLAG), and may then activate the active write flag signal (ACTW_FLAG) after lapse of a predetermined time.

As a result, the column controller 300 may control the column active operation in response to the read command signal (RD), and may output the control signal (CON) to the bank 400. In this example, the column controller 300 may receive the read command signal (RD) in response to the active read flag signal (ACTR_FLAG), such that it can operate only circuits associated with the read operation. Therefore, the circuits needed for the write operation do not operate such that an unnecessary operation current can be prevented from being consumed.

Thereafter, the column controller 300 may control the column active operation in response to the write command signal (WT), and may output the control signal (CON) to the bank 400. In this example, the column controller 300 may receive the write command signal (WT) in response to the active write flag signal (ACTW_FLAG), such that it can operate only circuits associated with the write operation. Therefore, the circuits needed for the read operation do not operate such that an unnecessary operation current can be prevented from being consumed.

Thereafter, the command decoder 100 may activate the precharge signal (PCG). Here, the precharge signal (PCG) may be activated to a high level pulse during one cycle of the clock signal (CLK).

As a result, the row controller 200 may deactivate the active write flag signal (ACTW_FLAG) and the active read flag signal (ACTR_FLAG). The column controller 300 may output the control signal (CON) needed to perform the precharge operation in response to the precharge signal (PCG) to the bank 400, without receiving the write command signal (WT) and the read command signal (RD).

As described above, an embodiment of FIG. 5 can perform the read operation after completion of the active operation, and can perform the write operation without execution of an additional active operation. An embodiment of FIG. 5 may be used to reduce a test time.

As is apparent from the above description, the semiconductor device according to the embodiments can allow information regarding an operation command to be performed after reception of an active command to be included in the active command, such that the operation efficiency can be increased and unnecessary current consumption can be reduced.

Figure 6:
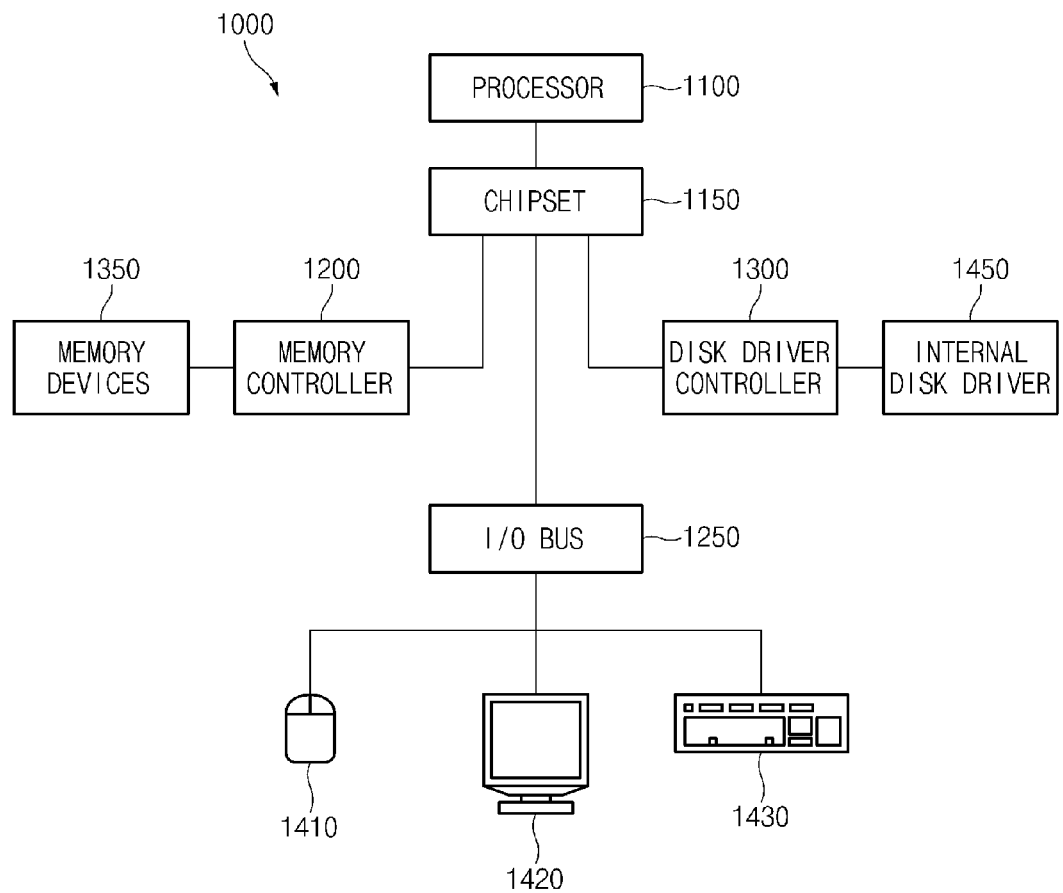
FIG. 6 illustrates a block diagram of an example of a representation of a system employing a semiconductor device in accordance with the various embodiments discussed above with relation to FIGS. 1-5.

The semiconductor devices discussed above (see FIGS. 1-5) are particular useful in the design of memory devices, processors, and computer systems. For example, referring to FIG. 6, a block diagram of a system employing a semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device as discussed above with reference to FIGS. 1-5. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 6 is merely one example of a system 1000 employing a semiconductor device as discussed above with relation to FIGS. 1-5. In alternate embodiments, such as, for example but not limited to, cellular phones or digital cameras, the components may differ from the embodiments illustrated in FIG. 6.

Those skilled in the art will appreciate that the embodiments may be carried out in other specific ways than those set forth herein without departing from the spirit and essential characteristics of the description. The above embodiments are therefore to be construed in all aspects as illustrative and not restrictive. All changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the description have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
   a command decoder configured to decode a clock signal, a chip selection signal, and a command address, and output an active write signal, an active read signal, and a precharge signal indicating a write operation or a read operation after completion of an active operation;
   a row controller configured to output a bank active signal for controlling an active operation of a bank in response to the active write signal, the active read signal, and the precharge signal, and output an active write flag signal or an active read flag signal for performing the write operation or the read operation; and
   a column controller configured to output a control signal for controlling a column active operation to the bank in response to the active write flag signal, the active read flag signal, a write command signal, a read command signal, and the precharge signal,
   wherein: if the precharge signal is activated, the row controller deactivates the active write flag signal and the active read flag signal.

2. The semiconductor device according to claim 1, wherein:
   the active write signal is a command signal indicating information to which a write operation command is applied after completion of the active operation; and
   the active read signal is a command signal indicating information to which a read operation command is applied after completion of the active operation.

3. The semiconductor device according to claim 2, wherein:
   The active write signal includes write access timing information after completion of the active operation; and
   the active read signal includes read access timing information after completion of the active operation.

4. The semiconductor device according to claim 1, wherein:
   the active write flag signal is a flag signal for performing the write operation after completion of the active operation; and
   the active read flag signal is a flag signal for performing the read operation after completion of the active operation.

5. The semiconductor device according to claim 1, wherein the column controller includes:
   a write operation circuit unit synchronized with a write clock signal during the write operation; and
   a read operation circuit unit synchronized with a read clock signal during the read operation.

6. The semiconductor device according to claim 5, wherein:
   only the write operation circuit unit of the column controller is configured to operate in response to the write command signal when the active write flag signal is activated; and
   only the read operation circuit unit of the column controller is configured to operate in response to the read command signal when the active read flag signal is activated.

7. The semiconductor device according to claim 5, wherein the column controller includes:
   a power-supply controller configured to provide a write operation power-supply voltage to the write operation circuit unit, and provide a read operation power-supply voltage to the read operation circuit unit.

8. The semiconductor device according to claim 7, wherein:
   if the active write flag signal is activated, the power-supply controller provides the write operation power-supply voltage and cuts off the read operation power-supply voltage; and
   if the active read flag signal is activated, the power-supply controller provides the read operation power-supply voltage and cuts off the write operation power-supply voltage.

9. The semiconductor device according to claim 1, wherein:
   if the active write signal is activated, the row controller activates the bank active signal and the active write flag signal.

10. The semiconductor device according to claim 1, wherein:
    if the active write flag signal is activated, the column controller controls the control signal in response to the write command signal.

11. The semiconductor device according to claim 1, wherein:
    if the active read signal is activated, the row controller activates the bank active signal and the active read flag signal.

12. The semiconductor device according to claim 1, wherein:
    if the active read flag signal is activated, the column controller controls the control signal in response to the read command signal.

13. The semiconductor device according to claim 1, wherein:
    if the precharge signal is activated, the column controller controls the control signal in response to the precharge signal, without receiving the write command signal and the read command signal.

14. The semiconductor device according to claim 1, wherein:
    if a test signal is activated, the command decoder deactivates the write command signal and the read command signal, irrespective of the command address.

15. The semiconductor device according to claim 14, wherein the test signal is controlled by a setting record command signal (MRW).

16. The semiconductor device according to claim 14, wherein:
    if the test signal is activated, the command decoder deactivates the active write signal and the active read signal.

17. The semiconductor device according to claim 14, wherein:
    if the test signal is activated, the row controller deactivates the bank active signal, the active write flag signal, and the active read flag signal.

18. The semiconductor device according to claim 1, wherein:
    if a test signal is activated, the command decoder deactivates the write command signal and the read command signal, irrespective of the command address.

19. The semiconductor device according to claim 18, wherein:
    if the test signal is activated, the row controller activates the bank active signal, the active write flag signal, and the active read flag signal.

20. The semiconductor device according to claim 19, wherein the row controller activates the active read flag signal, and then activates the active write flag signal after lapse of a predetermined time.

21. A semiconductor device comprising:
- a bank configured to have an activation state of the bank controlled by a bank active signal, and to have a column active operation of the bank controlled by a control signal; and
- a column controller including a write operation circuit unit and a read operation circuit unit, and configured to output a control signal for controlling the column active operation of the bank for a write operation or read operation of the bank, in response to an active write flag signal and an active read flag signal for performing the write operation or the read operation,
- wherein the column controller is configured to use different power-supply voltages for the write and read operation circuit units for the write operation and the read operation,
- wherein: if a precharge signal is activated, a row controller deactivates the active write flag signal and the active read flag signal.

22. The semiconductor device of claim 21, wherein, during the read operation, the write operation circuit unit is turned off and the read operation circuit unit operates to perform the read operation.

23. The semiconductor device of claim 21, wherein, during the write operation, the read operation circuit unit is turned off and the write operation circuit unit operates to perform the write operation.

24. The semiconductor device of claim 21, wherein the column controller further includes:
- a power-supply controller configured to supply the write operation circuit unit with a write operation power-supply voltage during a write operation, and supply the read operation circuit unit with a read operation power-supply voltage during the read operation.

25. The semiconductor device of claim 21, further comprising:
- a row controller configured to output the bank active signal for controlling an active operation of the bank in response to an active write signal, an active read signal, and the precharge signal, and output the active write flag signal or the active read flag signal for performing the write operation or the read operation,
- wherein the column controller is configured to use the different power-supply voltages for the write and read operation circuit units for the write operation and the read operation in response to the active write flag signal or the active read flag signal.

26. The semiconductor device of claim 25, further comprising:
- a command decoder configured to decode a clock signal, a chip selection signal, and a command address, and output the active write signal, the active read signal, and the precharge signal indicating the write operation or the read operation after completion of the active operation of the bank.

27. The semiconductor device of claim 21, wherein the bank includes a plurality of banks, each of the banks includes a plurality of memory arrays, each memory array configured for selection of a word line with a row address and for selection of a bit line with a column address, the column address controlled by the control signal.

28. A column controller comprising:
- a column controller including a write operation circuit unit and a read operation circuit unit, and configured to output a control signal for controlling a column active operation of a bank for a write operation or read operation of the bank, in response to an active write flag signal and an active read flag signal for performing the write operation or the read operation,
- wherein the column controller is configured to use different power-supply voltages for the write and read operation circuit units for the write operation and the read operation,
- wherein: if a precharge signal is activated, a row controller deactivates the active write flag signal and the active read flag signal.

29. The column controller of claim 28, wherein the column controller further includes:
- a power-supply controller configured to supply the write operation circuit unit with a write operation power-supply voltage during a write operation, and supply the read operation circuit unit with a read operation power-supply voltage during the read operation.

30. The column controller of claim 28,
- wherein, during the read operation, the write operation circuit unit does not receive a power-supply voltage and the read operation circuit unit operates to perform the read operation with the power-supply voltage.

31. The column controller of claim 28,
- wherein, during the write operation, the read operation circuit unit does not receive a power-supply voltage and the write operation circuit unit operates to perform the write operation with the power-supply voltage.

* * * * *